United States Patent [19]
Freerks

[11] Patent Number: 6,089,543
[45] Date of Patent: Jul. 18, 2000

[54] TWO-PIECE SLIT VALVE DOOR WITH MOLDED-IN-PLACE SEAL FOR A VACUUM PROCESSING SYSTEM

[75] Inventor: Frederik W. Freerks, Cupertino, Calif.

[73] Assignee: Applied Materials, Inc., Santa Clara, Calif.

[21] Appl. No.: 08/893,812

[22] Filed: Jul. 11, 1997

[51] Int. Cl.[7] .................................................. F16K 1/32
[52] U.S. Cl. ............................................ 251/357; 251/356
[58] Field of Search ..................................... 251/356, 357

[56] References Cited

U.S. PATENT DOCUMENTS

| | | | |
|---|---|---|---|
| 3,558,097 | 1/1971 | DeFrees | 251/357 X |
| 3,764,104 | 10/1973 | Kempton | 251/357 |
| 4,154,426 | 5/1979 | Santy et al. | 251/357 X |
| 4,474,358 | 10/1984 | Bennett | 251/357 |
| 4,682,759 | 7/1987 | Hall et al. | 251/356 X |
| 4,785,962 | 11/1988 | Toshima | 220/260 |
| 4,915,355 | 4/1990 | Fort | 251/357 |
| 5,226,632 | 7/1993 | Tepman et al. | 251/335.3 |
| 5,273,071 | 12/1993 | Oberrecht | 251/357 X |
| 5,275,303 | 1/1994 | Szalai | 220/264 |
| 5,363,872 | 11/1994 | Lorimer | 137/1 |
| 5,579,718 | 12/1996 | Freerks | 118/733 |

FOREIGN PATENT DOCUMENTS

735574 A1   10/1996   European Pat. Off. .

OTHER PUBLICATIONS

Parker Seals, "Gask–O–Seal Handbook," Parker Hannifin Corporation, 1991.
Parker Gask–O–Seals, page 3.

*Primary Examiner*—Stephen M. Hepperle
*Assistant Examiner*—John Bastianelli
*Attorney, Agent, or Firm*—Thomason Moser & Patterson

[57] ABSTRACT

A vacuum processing system may have a two-piece slit valve door, including a seal plate mounted on a mounting member, for closing the slit valve in a vacuum chamber. The seal plate, the piece that actually contacts the slit valve, may have a molded-in-place seal for making the contact and preventing metal-to-metal contact between the door and the valve. The seal may have a parabolic profile and be adhesively bonded within a groove in order to enhance its compressive and sealing capabilities. The seal plate may be removable for ease of service or replacement. Any particles generated by metal-to-metal contact between the seal plate and its mounting member may be captured by an O-ring statically sealed around the periphery between the two pieces.

21 Claims, 10 Drawing Sheets

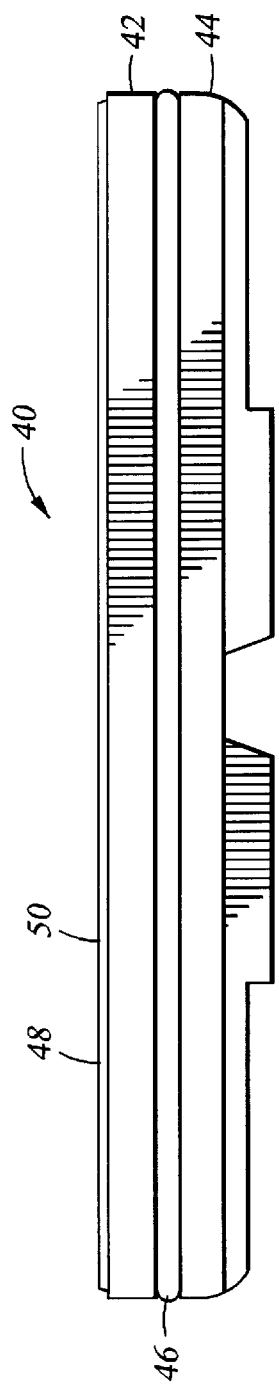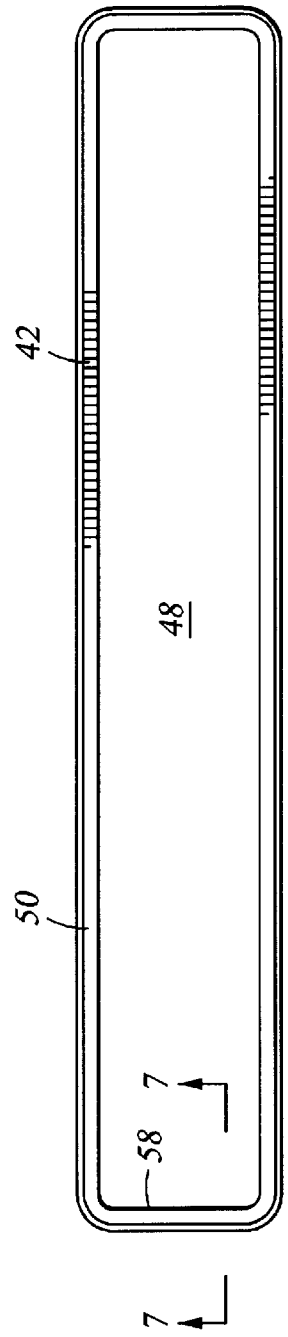

TWO-PIECE SLIT VALVE DOOR WITH MOLDED-IN-PLACE SEAL FOR A VACUUM PROCESSING SYSTEM

FIELD OF THE INVENTION

This invention relates generally to vacuum systems for manufacturing integrated circuits on wafers such as silicon wafers. More specifically, this invention relates to the valve door which seals the slit valve opening between two chambers in a vacuum processing system.

BACKGROUND OF THE INVENTION

Vacuum systems for manufacturing integrated circuits on wafers are generally known. A vacuum processing system may typically have a centralized vacuum chamber, called a transfer chamber, which may be part of a mainframe, for transferring wafers from one process chamber or load lock chamber to the next. A vacuum processing system may also typically have some kind of subsystem, such as a mini-environment, for providing the wafers to the load locks and other chambers and for collecting them back in order to send them on to the next system for processing. This transfer chamber plus the peripheral chambers and staging areas are sometimes called a cluster tool.

Between two vacuum chambers, such as the transfer chamber and one of the process chambers, is a slit valve. The slit valve includes an elongated rectangular opening for providing physical access between the two vacuum chambers. For example, when the slit valve is open, a robot in the transfer chamber may retrieve a wafer from one vacuum chamber and insert it into another vacuum chamber using a long, thin blade to hold the wafer.

After the wafer has been inserted into a vacuum chamber, the slit valve may be closed and sealed with a slit valve door. The slit valve door must form an airtight seal for the slit valve so that the pressure differential between the two chambers will not cause a gas leak through the slit valve. There may also be a metal insert placed within the slit valve opening in order to form a better airtight seat for the slit valve door.

Slit valve doors have typically been made of metal. The metal to metal contact between a slit valve door and the metal insert may provide a very good seal, but a metal to metal contact may create microscopic particles that scrape off of the metal and get into the otherwise relatively clean environment of the vacuum chambers. Such particles may land on the wafers in the chambers, thereby contaminating them. Such contamination is extremely undesirable in the processing of wafers.

To reduce the contamination by particles from the slit valve, an O-ring has typically been placed in a groove in the slit valve door. Thus, a metal to metal contact is avoided, so no particles are thereby generated, and the O-ring provides a satisfactory seal for the slit valve.

Since the seal between the O-ring and the slit valve is not static, but rather is constantly being opened and closed such that there is rubbing and abrading on the O-ring from the slit valve insert, there is still some particle generation, typically from the O-ring. Attempts to stop this particle generation have not been very successful.

Another cause of particle generation from the O-ring has been the rubbing and abrading due to the shape of the groove, or gland, which holds the O-ring in place on the slit valve door. Excessive particle generation, sufficient to render an IC chip defective, at 0.3 microns and smaller have been reported by users. This much particle generation may be sufficient to render an IC chip defective. As seen in FIG. 1, the O-ring 2 has been placed into a dovetail channel 4. The O-ring 2 has a larger diameter than the distance between corners 6, but since it is made of a flexible material, such as rubber, it can be massaged into the gland 4. The O-ring 2 is thus held in place by the sides 8 and the bottom 9 of the gland 4, but in some cases, the O-ring has actually been extracted from the gland during slit valve operation. When the surface of slit valve insert 7 presses against O-ring 2, O-ring 2 is compressed in the direction of arrow A. This compression causes O-ring 2 to expand outwardly against the sides 8. This action causes an abrasion on the O-ring 2 against the sides 8. Additionally, the sharp corners 6 cause even worse abrasion on O-ring 2. All of this abrasion causes particle generation which can contaminate the wafers in the vacuum chambers.

A further problem with the O-rings used in the slit valve doors has been that the O-rings may stick to the slit valve seat, so that when the door opens, the O-ring may be partially pulled out of the dovetail groove, which can damage the O-ring, cause particle generation, and require early servicing of the chamber.

Additionally, the amount of squeeze on the O-ring when metal-to-metal contact occurs will destroy the O-ring in short order due to over-compression and extrusion. The over-compression is a systemic problem that cannot be easily solved. For example, at 80 psig air pressure on a door designed for use with a 200 mm wafer, the force exerted by the 80 mm diameter actuating cylinder is 822 lb. The O-ring seal is designed for normal operation at 15 pounds per linear inch (pli) or 288 lb. of total force. In another example, with the transfer chamber at vacuum, and the process chamber at atmosphere, it takes 464 lb. of actuator force to keep the seal compressed at 15 pli and atmosphere from leaking into the transfer chamber. If this amount of force were to be applied during normal system operation, the O-ring would be severely over compressed.

One way of solving the over-compression problem uses an actuator cylinder with an easily adjustable mechanical stop. The actuator cylinder is the device that closes and opens the slit valve door. A mechanical stop may allow for the compression of the seal to be set within 0.003 to 0.005 inches. This range gives a maximum compression of 520 pounds, or about 27 pounds per linear inch, which is below the upper compressive limits of most seal materials. A mechanical stop on the actuator cylinder, however, does not solve all of the O-ring abrasion and particle generation problems.

It is, therefore, desirable to have a vacuum processing system that provides a slit valve seal that reduces the number of particles generated compared with the prior art, is easy to service or remove, and has a long service life.

SUMMARY OF THE INVENTION

A vacuum processing system may open and close the slit valve with a seal plate having a seal molded-in-place in a groove around the periphery of the seal plate. This seal plate may be mounted to the slit valve door or form a part of the valve seat so that it may be easily removed for service or replacement. A seal ring between the seal plate and its mounting member may capture particles generated in the contact between the seal plate and the mounting member. A ridge near the periphery of the mounting member may provide the contact with the seal plate and may be aligned with the molded-in-place seal. The seal ring may be taller than the ridge, so it is compressed when the seal plate contacts the mounting member.

In one aspect, the molded-in-place seal may have a parabolic shape near the slit valve, and toward the groove it may have a contour matching the groove. A force on the seal may cause it to compress in the direction of the applied force, expand perpendicular to the compressive force, and press against the sides of the groove. The molded-in-place seal may be adhesively connected to the groove or otherwise fastened therein.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4 is a side view of a two-piece slit valve door.

FIG. 5 is a plan view of the face of a seal plate.

DETAILED DESCRIPTION OF A PREFERRED EMBODIMENT

Figure 1:
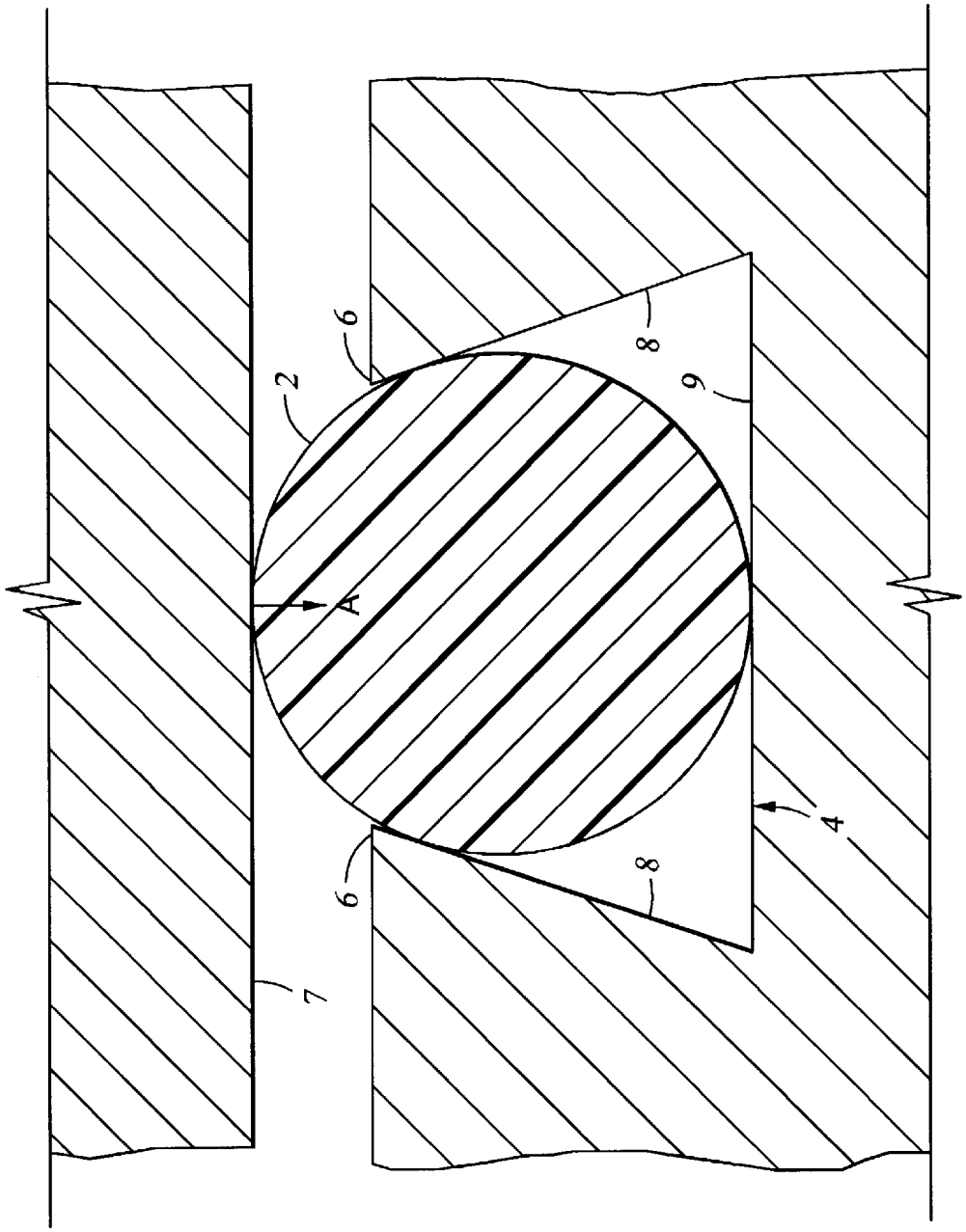
FIG. 1 is a prior art drawing of an O-ring and groove.
Figure 2:
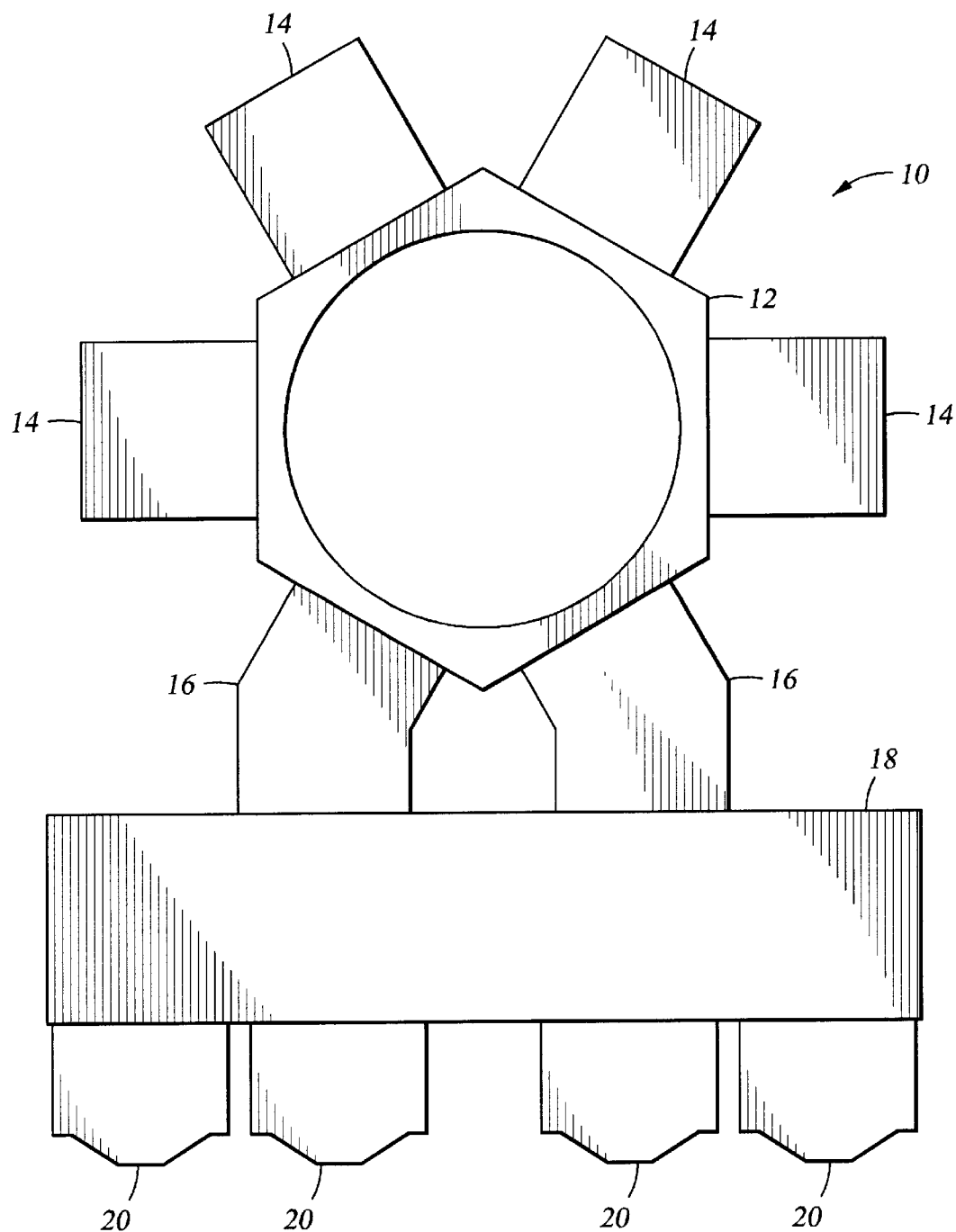
FIG. 2 is a top schematic view of a vacuum system.

FIG. 2 is a top schematic view of a vacuum processing system 10 generally showing a series of vacuum chambers 14 attached to a central vacuum transfer chamber 12. A pair of vacuum load lock chambers 16 are shown providing a passageway to a mini-environment 18. Pod loaders 20 are shown attached to the mini-environment 18. This system is an example of a cluster tool.

In this arrangement, the vacuum chambers 14 may be connected to the transfer chamber 12 at an airtight seal which permits wafers to pass between two chambers 12, 14, 16 without losing the vacuum in the chambers 12, 14, 16. The pod loaders 20 are attached to the mini-environment 18 and may be loaded with wafer cassettes (wafer holders) by a person or by an automated machine that is part of the over-all automated manufacturing system of the manufacturing plant or building that houses the vacuum processing system 10. A robot (not shown) within the mini-environment 18 may move the wafers or cassettes from the pod loaders 20 to the load lock chambers 16 and back again. A robot (not shown) with an arm and a blade for moving wafers within transfer chamber 12 may move the wafers from one of the load lock chambers 16 to the process chambers 14 and back to one of the load lock chambers 16.

Vacuum chambers 14 may be any of several types of process chambers, such as a chemical vapor deposition (CVD) chamber, a physical vapor deposition (PVD) chamber, an etch chamber, etc., for performing on a wafer some type of process in a series of many processes for manufacturing integrated circuits on wafers. It is not unusual for a manufacturer of vacuum chambers to have over twenty different types of such process chambers, each with some common features, but for performing different processes on the wafers.

Figure 3:
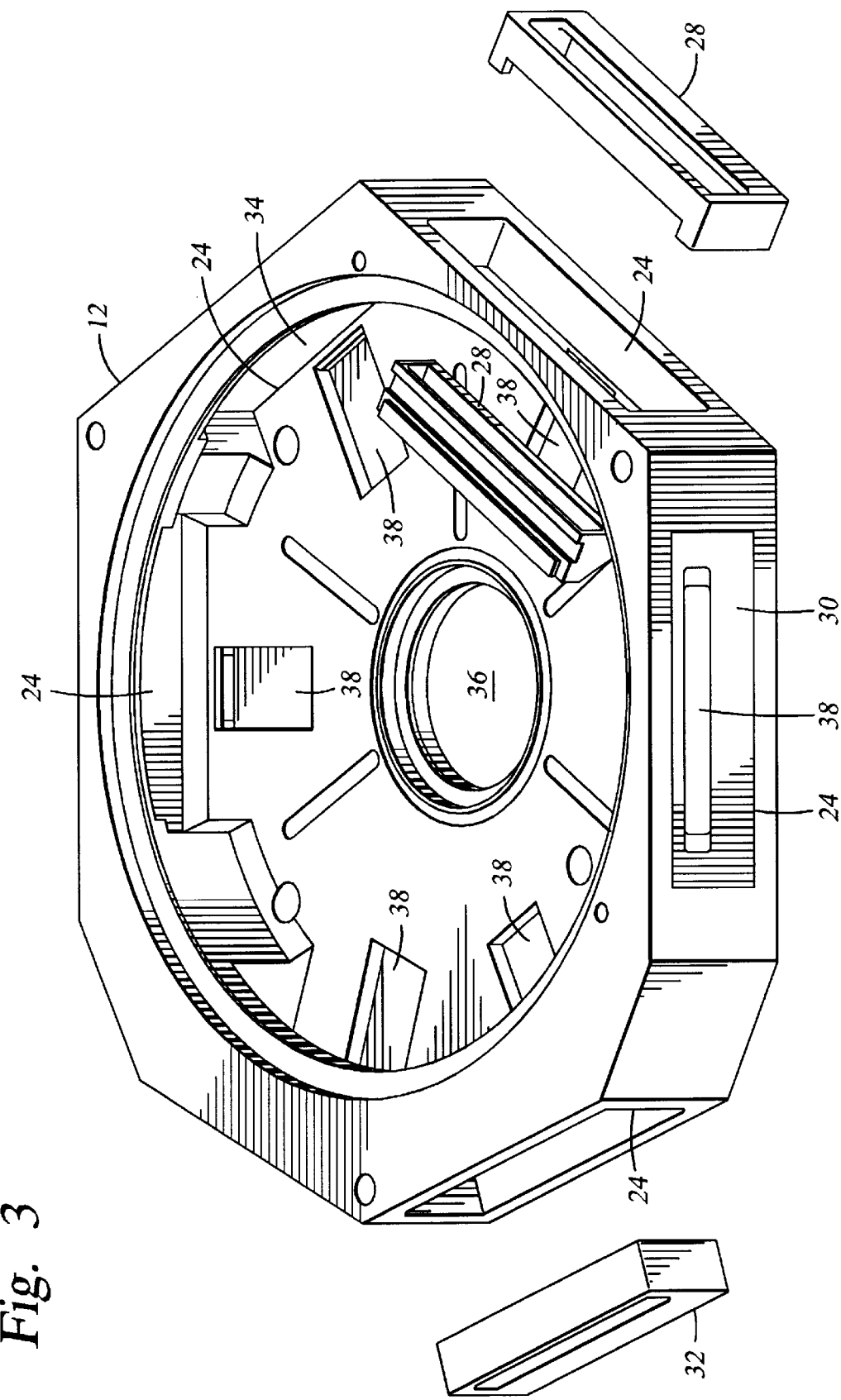
FIG. 3 is a perspective view of a transfer chamber with the lid off.

FIG. 3 is a perspective view of an example of a transfer chamber 12 with the lid removed so that the interior of the transfer chamber 12 is visible. Several slit valves with openings 24 and examples of slit valve inserts 28, 30, 32, 34 are shown. Circular opening 36 supports a robot with an arm for moving wafers inside the transfer chamber 12, but the robot is not shown in this drawing so other details of the transfer chamber 12 may be visible. Openings 38 provide access for an actuating cylinder for manipulating a slit valve door such as the one shown in FIG. 4. The actuating cylinder and the slit valve door are not shown so that other features in the transfer chamber 12 may be visible. An example of a slit valve door and actuating cylinder is shown and described in U.S. Pat. No. 5,226,632, issued Jul. 13, 1993, and incorporated herein by reference as if fully set forth below.

FIG. 4 is a side view of a two-piece slit valve door 40 with a seal plate 42 and a mounting member 44. Typically, the seal plate 42 and the mounting member 44 are made of metal such as aluminum or stainless steel. Between the seal plate 42 and the mounting member 44 is an O-ring 46 for sealing between the two pieces 42, 44. On front face 48 of seal plate 42 is a molded-in-place seal 50 for contacting with the slit valve insert 28, 30, 32, 34 or a seat portion formed thereon. The seal plate 42 may be attached to the mounting member 44 with any appropriate means, including a series of screws, that may permit seal plate 42 to be removed from the mounting member 44. Removal of the seal plate 42 facilitates servicing or replacement of the plate 42. Thus, when a seal 50 wears out from continued use, the whole seal plate 42 may be replaced. Also, since the mounting plate 44 and the actuating cylinder that moves the slit valve door 40 against a slit valve insert 28 are very difficult to disconnect, it is much easier and cheaper to have a removable seal plate 42 than to have an entire removable door 40 and/or related door assembly.

Molded-in-place seal 50 may be made of any suitable material that does not generate many, if any, particles under the dynamic loading experienced by the seal 50, such as a variety of fluorocarbon and perfluoro elastomers that suit the requirements of wafer processing. A suitable material may be a fluorocarbon elastomer such as Viton® 731, HPV 75 or HP-1 available from Greene-Tweed & Co. at Kulpsville, Pa.; E. I. DuPont, DuPont Polymers Division at Wilmington, Del.; and Parker Seal, subsidiary of Parker Hanafin Corp. at San Diego, Calif., respectively. However, other materials that may generate an insignificant amount of particles under the dynamic loading described herein may be used.

The seal 50 helps overcome problems associated with O-ring seals on slit valve doors, such as short seal life, poor sealing, particle generation, and O-ring extraction. It also eliminates problems with metal-to-metal contact, seal/door gland abrasion, O-ring retention, and O-ring installation.

FIG. 5 is a plan view of front face 48 of seal plate 42. The molded-in-place seal 50 is molded into a groove 58 formed around the periphery of front face 48. The seal may be vulcanized to the seal plate 42. Thus, in the manufacturing of seal plate 42, the seal 50 may be permanently attached to the seal plate 42. Seal 50—may be adhesively bonded to the metal surface of groove 58. An example of a suitable bonding agent may be Chemlok Y1520A adhesive available from Lord Corporation, Elastomer Products of Erie, Pa. A molded-in-place seal eliminates the problem associated with rubbing and abrading of the O-ring in the groove as described above. The general dimension of the outer periphery of mounting plate 44 matches the outer periphery of seal plate 42. It is to be understood that a seal ring with the same cross section as seal 50 (described below) that is not molded-in-place, but rather is removable so that it would not be necessary to make seal plate 42 removable is contemplated by the invention.

Figure 6:
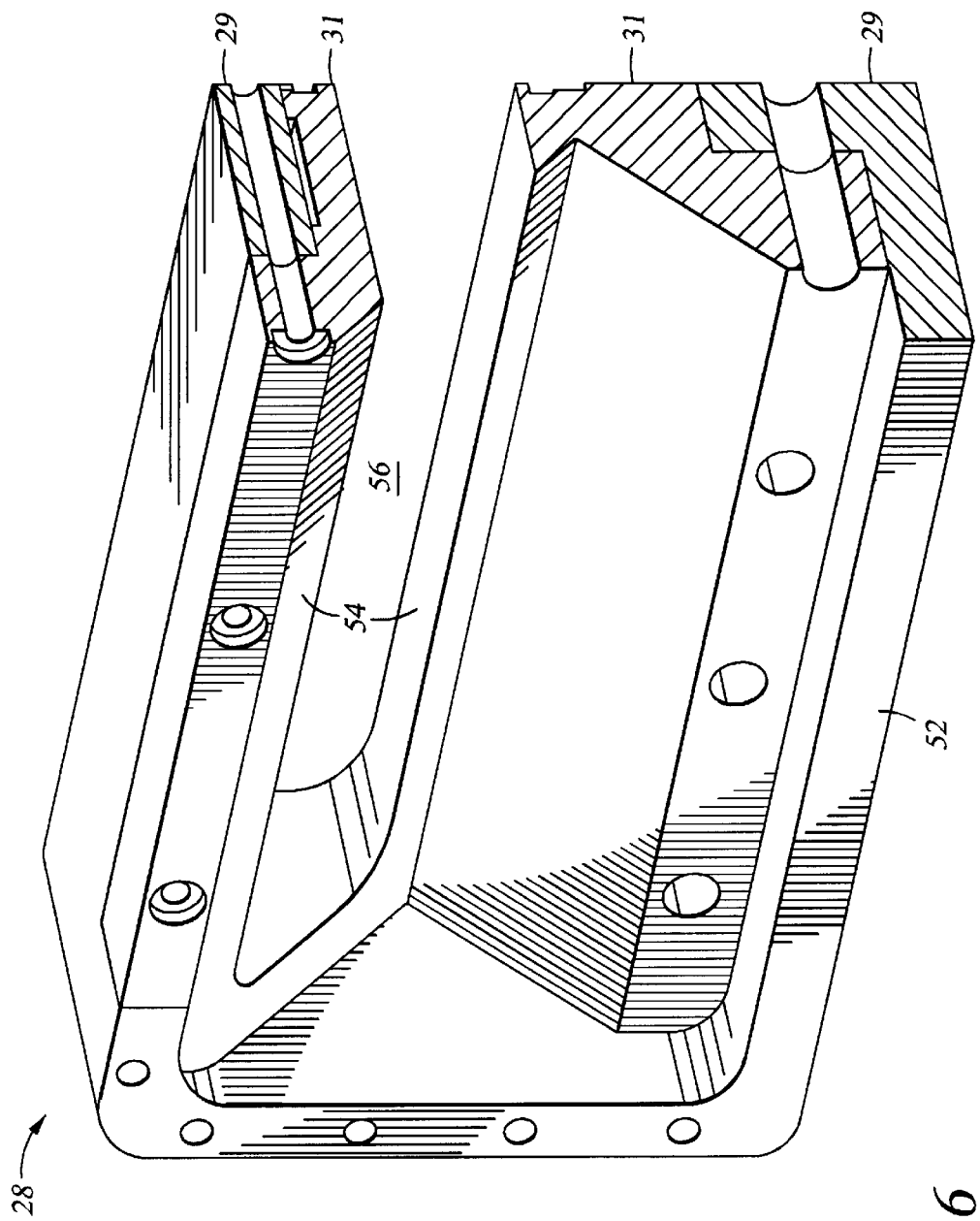
FIG. 6 is a perspective of a cut-away portion of a slit valve insert.

FIG. 6 is a cut-away view of an exemplary slit valve insert 28 having a valve seat 54 formed thereon. The right end of slit valve insert 28 has been cut away for enlargement purposes. The insert 28 shown has two-pieces, including an outer portion 29 that slides into slit valve opening 24 and an inner portion 31 that slides into the outer portion 29. Rear surface 52 of outer portion 29 faces the interior of the transfer chamber 12. Rear angular surface 54 of inner portion 31 faces toward the interior of the transfer chamber 12, but at a downward angle. The surface 54 forms the seat for sealing the slit valve with the seal 50 of seal plate 42. The outward facing surface of the inner portion 31 forms the seat for the seal with a process chamber 14. Within the slit valve opening 24, opening 56 is the actual opening between the transfer chamber 12 and a process chamber 14.

Slit valve door 40 may be actuated in a direction perpendicular to the plane in which its front face 48 is held by an actuating cylinder that protrudes out of opening 38. The seal 50 essentially matches angular face 54 of the inner portion 31 of insert 28. The actuating cylinder protruding out of opening 38 pushes slit valve door 40 up against slit valve insert 28 such that the molded-in-place seal 50 engages surface 54 making an airtight seal all around opening 56. Thus, when slit valve opening 24 is closed by slit valve door 40, the pressure in either the transfer chamber 12 or the process chamber 14 may change as needed without leakage between the two chambers.

Figure 7:
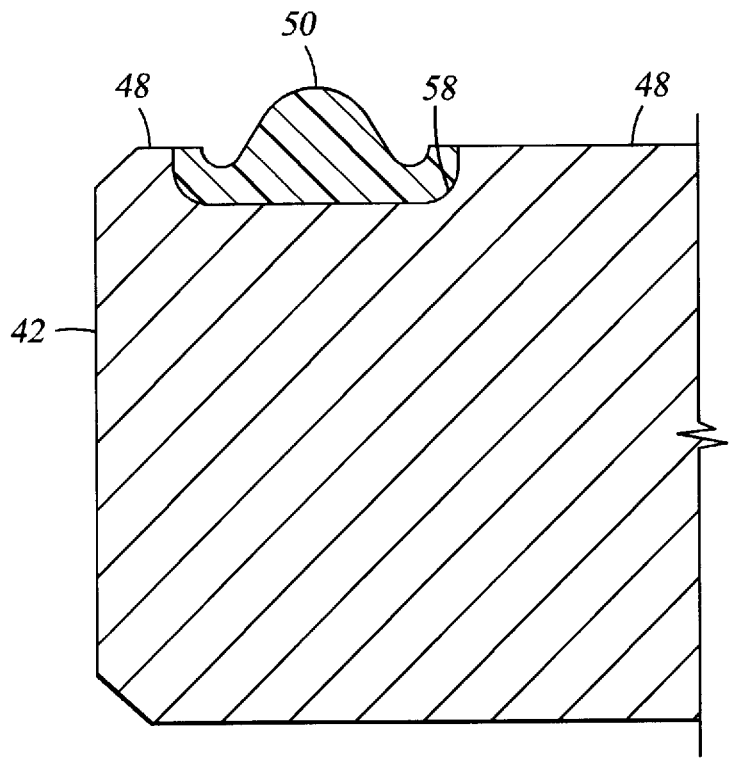
FIG. 7 is a cross section view of the edge of the seal plate showing the molded-in-place seal.
Figure 8:
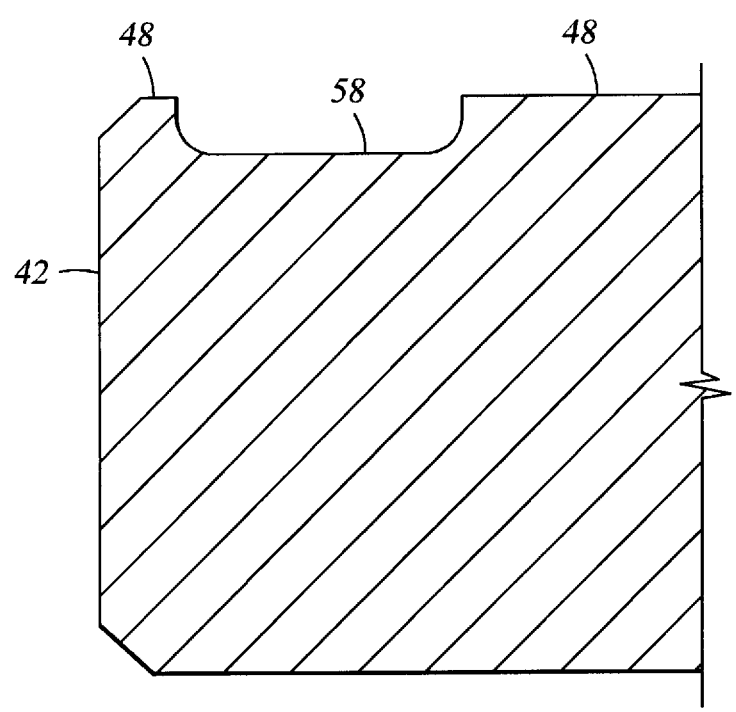
FIG. 8 is a cross section view of the edge of the seal plate without the molded-in-place seal.

FIG. 7 is section 7—7 of FIG. 5 and shows the edge of seal plate 42 with groove 58 formed therein near the periphery of front face 48. Molded-in-place seal 50 is shown in groove 58. The bottom contour of seal 50 matches the surface of the groove 58. FIG. 8 shows the same cross section, but without the seal 50, so that groove 58 is more clearly shown. Groove 58 has upwardly curving edges or sides that end almost vertical, or perpendicular, to front face 48. These sides of the groove 58 provide additional compressive advantages for the seal 50 as described below. The surface inside the groove may need a roughness from a 60-grit blast finish to enhance the adhesion between the seal 50 material and the groove 58.

Figure 9:
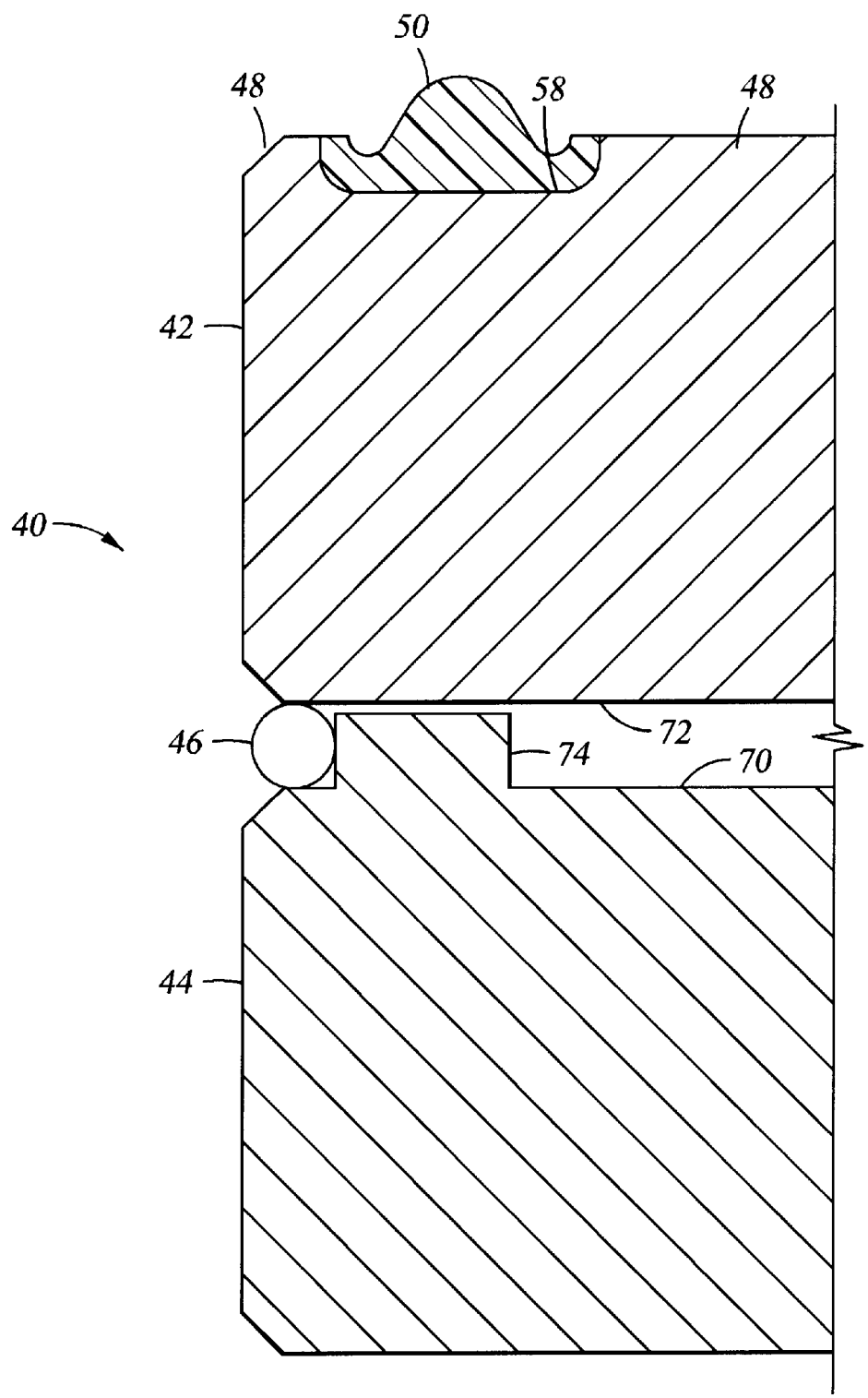
FIG. 9 is a cross section view of the edge of the seal plate and the mounting member.

FIG. 9 shows the same cross section as FIG. 7 of the edge of slit valve door 40, but including both the seal plate 42 and the mounting member 44. Mounting member 44 has a top surface 70 that essentially matches the bottom surface 72 of seal plate 42. Ridge 74 protrudes from surface 70 and continues around the mounting member 44 near the periphery of top surface 70 in much the same way that seal 50 continues around near the periphery of front face 48 in FIG. 5, so that ridge 74 is essentially aligned with seal 50. O-ring 46 sits on an outer shelf formed by ridge 74 and surface 70. Thus surfaces 70, 72 and ridge 74 effectively form a groove into which O-ring 46 is seated. In an alternative embodiment, O-ring 46 may be formed into an almost rectangular ring to match the outer periphery of the mounting member 44.

Mounting member 44 and seal plate 42 are shown in FIG. 9 with a small gap between ridge 74 and the bottom surface 72. In this configuration, seal plate 42 and mounting member 44 are not yet clamped tightly together in order to show that the O-ring 46 has a slightly larger diameter than the height of the ridge 74. Thus, when seal plate 42 and mounting member 44 are clamped tightly together, O-ring 46 is compressed and held in place.

When seal plate 42 and mounting member 44 are clamped tightly together, by a set of screws or other suitable clamping means, there is metal-to-metal contact between ridge 74 and surface 72. As described before, a metal-to-metal contact may generate particles. O-ring 46 thus provides a seal around the metal-to-metal contact which traps any particle therein and prevents any particles from entering the vacuum chambers. The contact of the O-ring 46 with surfaces 70, 72 and ridge 74 does not generate any particles. Since the seal is static, there is no movement of the joint, so there is no abrasion on the O-ring 46, and the O-ring does not generate particles.

When the slit valve door 40 is pushed up against the slit valve, mounting member 44 pushes seal plate 42, and seal 50 makes contact with valve seat 54 of insert 28. Since ridge 74 is aligned with seal 50, the force of the mounting member 44 pushing seal plate 42 against the slit valve is concentrated directly on the seal 50. Thus, ridge 74 provides the advantage of making sure that seal 50 makes good contact with the valve seat 54 around its entire circumference. Otherwise, if the entire surface 70 was at the height of ridge 74, then seal plate 42 could be warped by the force exerted in its middle.

Another advantage in having a ridge 74 on a mounting member 44 in a two-piece slit valve door 40 is that the smaller contact area between the mounting member 44 and the seal plate 42 will generate fewer particles than would the larger contact area that would occur if there was no ridge 74.

Figure 10:
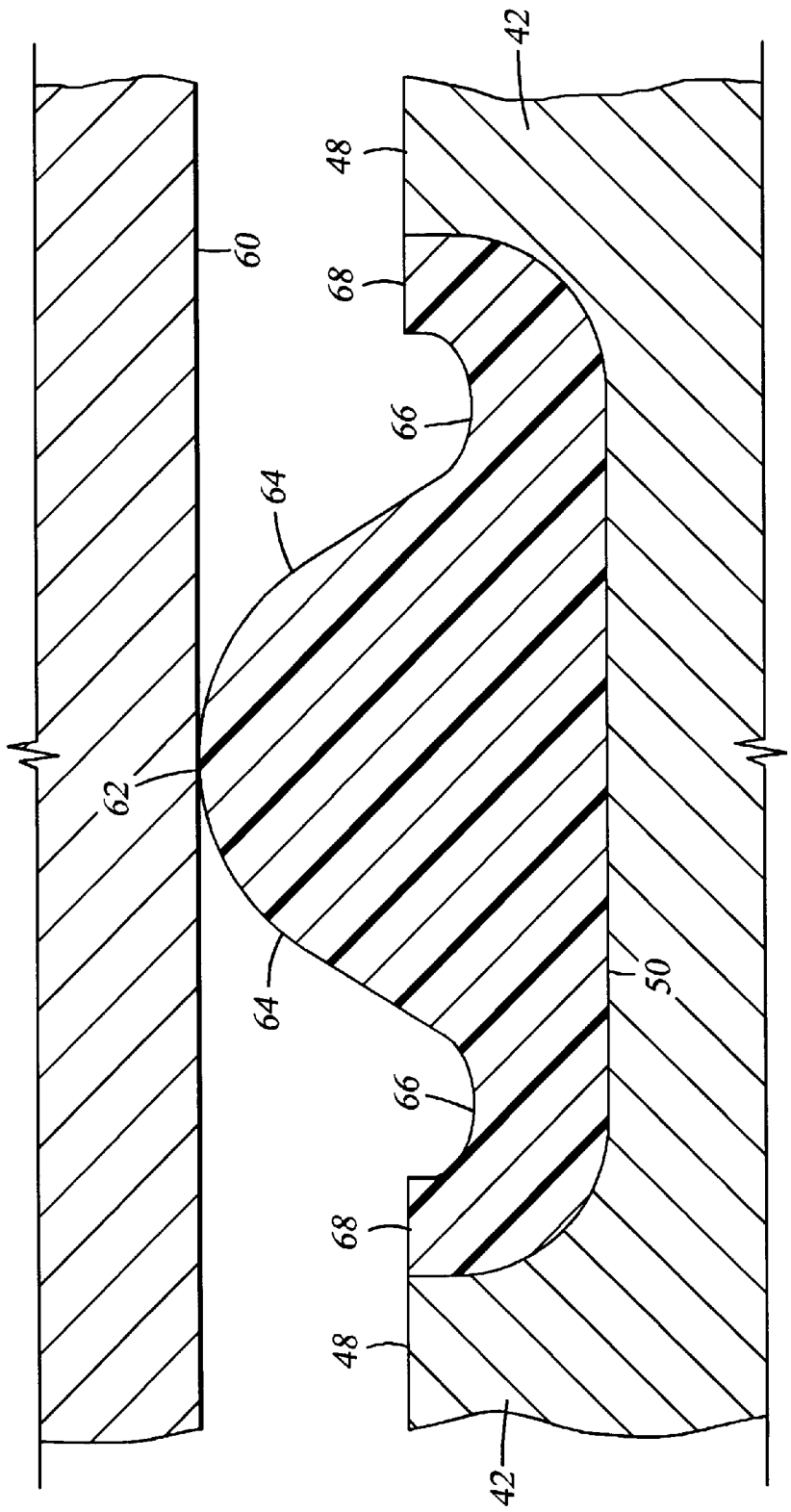
FIG. 10 is an enlarged view of the molded-in-place seal.

FIG. 10 shows an enlarged cross sectional view of the seal 50. A surface 60, such as angular surface 54 of slit valve insert 28 (shown in FIG. 6), is shown beginning to press against seal 50 at the apex 62 of its parabola-shaped top contour 64. The plane of front face 48 is shown below the level of the apex 62 of seal 50, so the seal 50 will contact the surface 60 well before front face 48 will contact surface 60. Troughs 66, or reliefs, are shown in the top contour 64 near the edges 68 of the seal 50 so that a trimming device may trim the edges 68 of seal 50 flush with front face 48 of seal plate 42 without cutting into the top contour 64.

Figure 11:
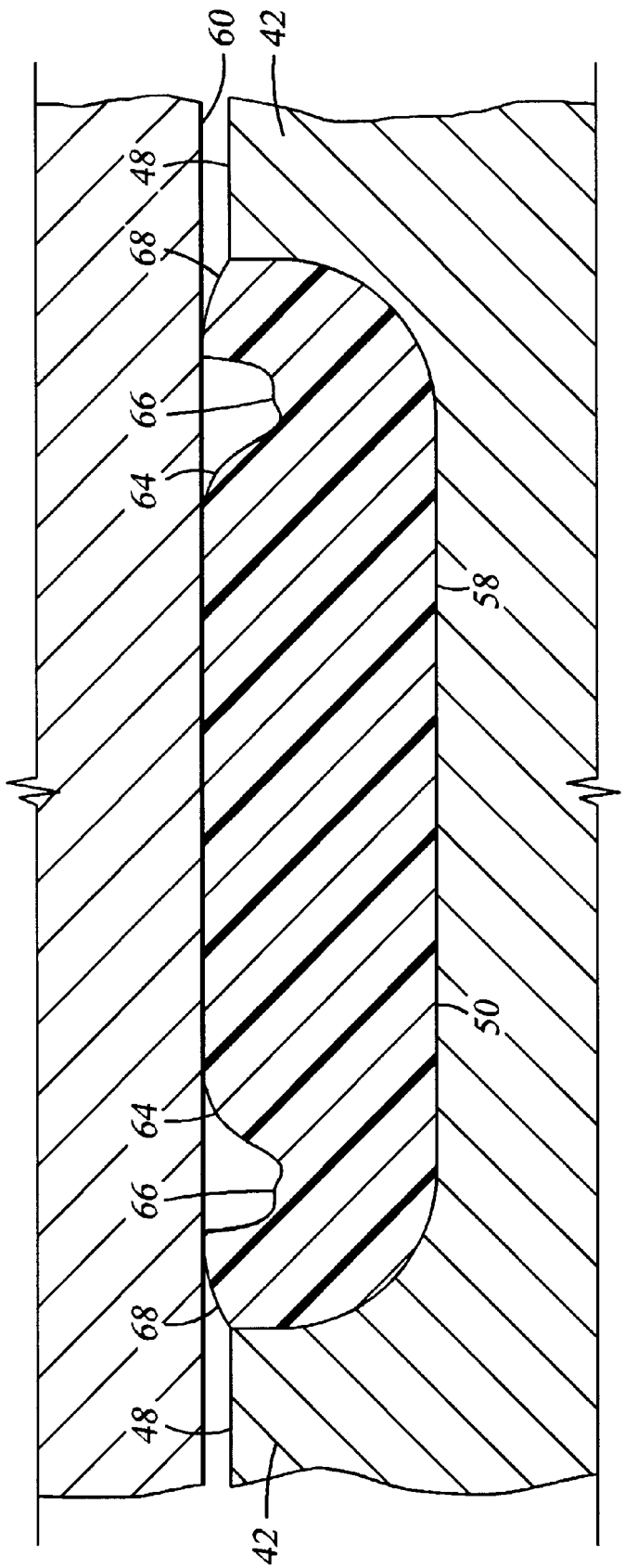
FIG. 11 is an enlarged view of the molded-in-place seal under a compressive load.

FIG. 11 shows the cross section of seal 50 when surface 60 presses fully on the top contour 64. Seal 50 is compressed from its former height, but it does not allow surface 60 to touch the front face 48 of seal plate 42. The edges 68 bulge up under the stress with the corners nearest troughs 66 bulging the farthest, while the entire bottom surface of seal 50 does not deform since it is adhesively bonded to the groove 58. Troughs 66 may form a bulge due to the induced stress. The parabolic shape of the cross section of the seal may be optimized so the compression stresses in both the vertical and horizontal axis will be translated evenly or uniformly throughout the area of its cross section. If the shape is too tall and narrow, then the compression stresses will be concentrated in the center of the seal and may even cause the seal to buckle. If the shape is too short and wide, then it may not take full advantage of the strength of the material or the compression load enhancement from the groove as described below. If the concentration of stress is too high in a small area a failure may result; while another area with a low concentration of stress may be under-used. A high stress in the vertical axis may damage the seal material. A high stress in the horizontal axis may damage the seal material, too, but may also cause it to tear at the adhesive bonding.

In this manner, the compression stresses in seal 50 due to the pressure from surface 60 are translated to the bottom contour surface and to groove 58. Thus, the stresses have both a vertical component and a horizontal component since the seal 50 attempts to expand outwardly and press on the groove 58 up to the sides that are near perpendicular with front face 48. The confinement of the seal 50 by the sides of the groove 58 adds to the load capability of the seal 50 because a confined seal will reach a greater compression stress with a smaller deflection than will an unconfined seal. As the apex of the unconfined seal is compressed down, the seal will expand and permit its edges to slide out of the groove rather than provide additional compression stress within the seal. In so doing, the unconfined seal will deflect more under a lower compression stress than will the confined seal; thus, risking metal-to-metal contact at the lower compression stress.

Another advantage of the seal structure described herein is in the permeability of the seal 50. Every material has some degree of permeability, and high permeability is very undesirable in a seal in a vacuum chamber. Two factors that limit permeability in a substance are the density of the substance and the distance to permeate through the substance. The parabolic shape of the cross section of the seal 50 causes the seal 50 to be compacted, as described above, much denser than otherwise under the combined action of the vertical compression of the seal 50 and the horizontal confinement by groove 58, thus reducing its permeability more effectively. Additionally, the expansion of the total area that contacts surface 60 as seen in FIG. 11, causes the seal to have a fairly long distance to permeate, thus further reducing its permeability and creating a better seal. This total contact area may also be called the critical area corresponding to a major surface on the parabolic surface of about a 120° angle, 60° on either side of the vertical centerline of the parabola measured from a vertical height at about the same level as front face 48.

Figure 12:
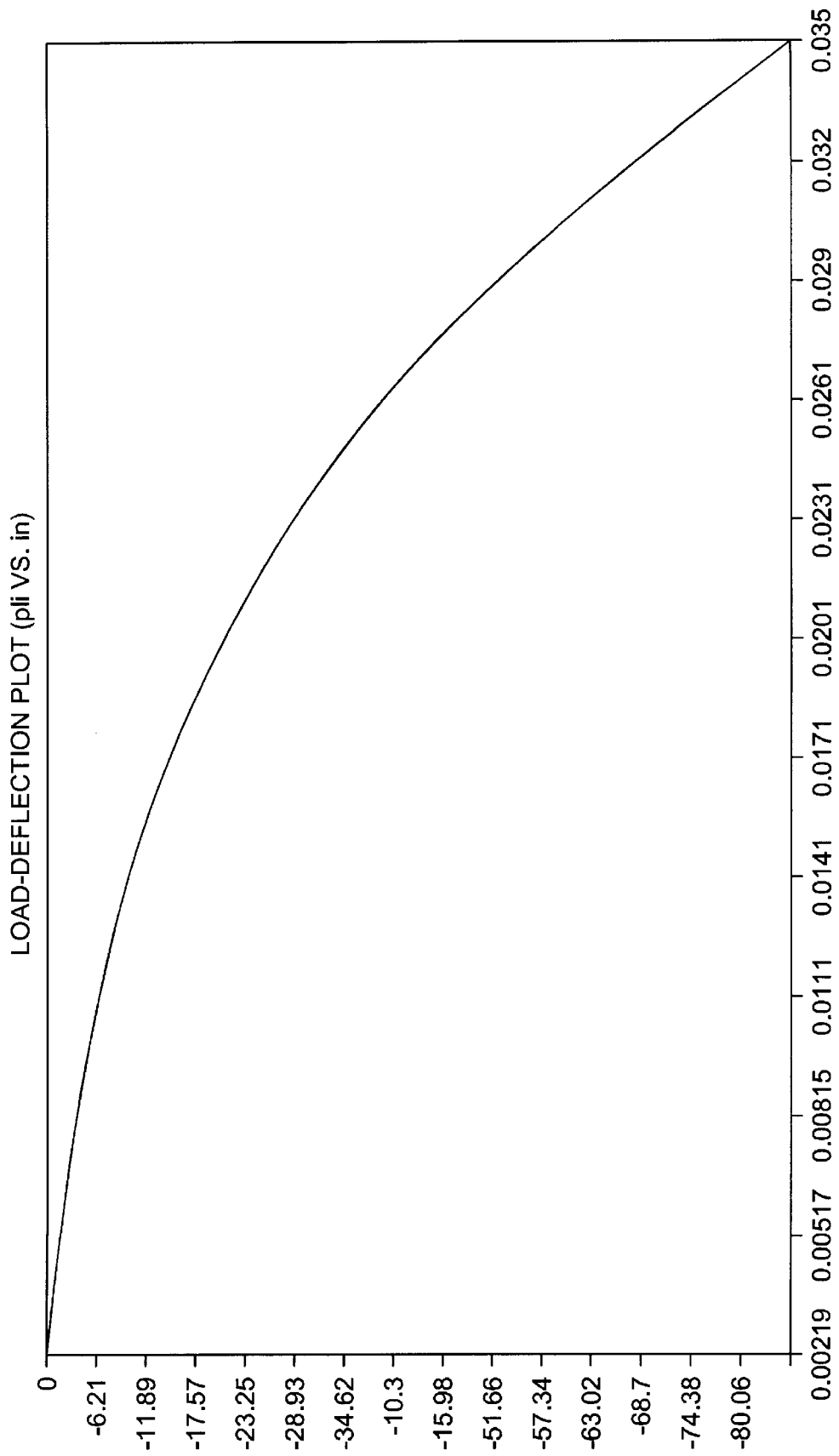
FIG. 12 is a Load vs. Deflection plot for the molded-in-place seal.

FIG. 12 is a plot from a finite analysis of the theoretical load (in pounds per linear inch) vs. Deflection (in inches) for the described cross section of seal 50. The finite analysis is performed on just one half of a cross section of the seal shape, so all of the load values in the plot must be doubled to correspond with actual load values. Actual experiments have shown that the performance is in fact a little better than this analysis shows. The plot shows that at a load of about 12.42 pli, the seal 50 will deflect, or compress, about 11.1 milli-inches, or mils. At a load of about 160 pli, the seal 50 will compress about 34 mils. Seal 50 has been shown to work sufficiently throughout the dynamic range shown, but the typical deflection experienced may be only in the range of about 14 mils to about 26 mils, correlating to a load in the range of about 18 pli to about 74 pli. By comparison, the O-rings previously used had a dynamic range of only about 12 pli to about 22 pli. Thus, the design of seal 50 allows a greater latitude in compressive forces, and reduces the possibility of metal-to-metal contact.

Testing has shown this seal to greatly improve the service life of the seal over the previous O-ring design. In other words, whereas an O-ring might have to be replaced after about 500 loading cycles, the seal described herein may not have to be replaced until after several thousand loading cycles. Replacement intervals of 3–15 times longer than with conventional O-ring seals have been possible. Thus, even though one seal plate 42 may cost considerably more than one O-ring, fewer of them are used, so the total cost of ownership may be reduced. When used in conjunction with a mechanical stop on the actuator cylinder, the service life of the seal 50 may be increased even more; and when used in high temperatures, >100° C., the addition of a mechanical stop may be recommended.

While the foregoing is directed to the preferred embodiment of the present invention, other and further embodiments of the invention may be devised without departing from the basic scope thereof, and the scope thereof is determined by the claims which follow.

I claim:

1. A vacuum processing system comprising:
   two or more chambers in fluid communication with each other;
   an opening disposed between the two or more chambers;
   a seal plate disposed adjacent the opening and removably mounted to a mounting member;
   a groove formed in the seal plate near a periphery of the seal plate and having a seal molded at least partially thereon; and
   a seal ring disposed between the mounting member and the seal plate along a periphery of the mounting member and the seal plate.

2. The vacuum processing system of claim 1 wherein:
   the seal has a substantially parabolic sealing surface.

3. The vacuum processing system of claim 2 wherein the parabolic sealing surface is convex near an apex of the seal and the seal has a convex shape on each side of the parabolic sealing surface.

4. The vacuum processing system of claim 1 wherein the seal plate is mounted to a mounting member disposed within at least one of the chambers, the mounting member having a substantially planar face and a ridge disposed near a periphery of the substantially planar face.

5. A vacuum processing system comprising:
   two or more chambers in fluid communication with each other;
   an opening disposed between the two or more chambers;
   a mounting member disposed within at least one of the chambers;
   a seal plate having a seal and being removably mounted to the mounting member; and
   a seal ring disposed between the mounting member and the seal plate along a periphery of the mounting member and the seal plate.

6. A vacuum processing system comprising:
   two or more chambers in fluid communication with each other;
   an opening disposed between the two or more chambers;
   a mounting member disposed within at least one of the chambers;
   a seal plate mounted to the mounting member on a first side and having a seal on a second side opposing the first side; and
   a seal ring disposed between the mounting member and the seal plate along a periphery of the mounting member and the seal plate.

7. The vacuum processing system of claim 6 wherein:

the mounting member has a substantially planar face and further comprises
 a ridge disposed near a periphery of the substantially planar face, the ridge being substantially aligned with the seal of the seal plate.

8. The vacuum processing system of claim 7 wherein:

the seal plate has a substantially planar face; and the seal ring is displaced adjacent an outer surface of the ridge and is taller than the ridge.

9. A valve door for use in a vacuum processing system, the valve door comprising:
 a seal plate mounted to a mounting member and disposed adjacent a valve of the vacuum processing system;
 a seal ring disposed between the mounting member and the seal plate; and
 a groove formed near a periphery of the seal plate and having a seal formed in place on said groove which conforms to the shape of the groove in an uncompressed state.

10. The valve door of claim 9 wherein the seal plate is removably mounted to the mounting member.

11. The valve door of claim 10 wherein the seal ring is disposed along a periphery of the mounting member and the seal plate.

12. The valve door of claim 9 wherein the seal plate is mounted to a mounting member disposed within at least one of the chambers, the mounting member having a substantially planar face and a ridge disposed near a periphery of the substantially planar face.

13. The valve door of claim 9 wherein:

the seal has a substantially parabolic sealing surface.

14. The valve door of claim 13 wherein:

the parabolic sealing surface is convex near an apex of the seal and the seal has a convex shape on each side of the parabolic sealing surface.

15. The valve door of claim 9 wherein:

the seal is adhesively connected to a surface of the groove.

16. A valve door for use in a vacuum processing system, comprising:
 a mounting member;
 a seal plate having a seal and being removably mounted to the mounting member; and
 a seal ring disposed between the mounting member and the seal plate.

17. A valve door for use in a vacuum processing system, comprising:
 a mounting member;
 a seal plate having a seal, the seal plate being mounted to the mounting member and having a portion that contacts a portion of the mounting member; and
 a seal ring disposed between the mounting member and the seal plate along a periphery of the mounting member and the seal plate.

18. The valve door of claim 17 wherein:

the mounting member has a substantially planar face and further comprises a ridge disposed near a periphery of the substantially planar face, the ridge being substantially aligned with the seal of the seal plate.

19. The valve door of claim 18 wherein:

the seal plate has a substantially planar face; and the seal ring is displaced adjacent an outer surface of the ridge and is taller than the ridge.

20. A vacuum processing system comprising:
 two or more chambers in fluid communication with each other;
 a valve disposed between the two or more chambers;
 a seal plate disposed adjacent the valve, the seal plate being mounted to a mounting member;
 a seal ring disposed between the mounting member and the seal plate along a periphery of the mounting member and the seal plate;
 a groove formed in the seal plate near a periphery of the seal plate; and
 a seal disposed in the groove.

21. The vacuum processing system of claim 17 wherein:

the seal plate is removably mounted to the mounting member.

* * * * *